United States Patent [19]
L'Esperance, III et al.

[11] Patent Number: 5,174,021
[45] Date of Patent: Dec. 29, 1992

[54] DEVICE MANIPULATION APPARATUS AND METHOD

[75] Inventors: Leroy D. L'Esperance, III, Blackwood, N.J.; Hung N. Nguyen, Bensalem, Pa.; Frederick Simchock, Trenton, N.J.

[73] Assignee: AT&T Bell Laboratories, Murray Hill, N.J.

[21] Appl. No.: 708,327

[22] Filed: May 31, 1991

[51] Int. Cl.⁵ ............................ H05K 3/34; B23P 19/00
[52] U.S. Cl. ............................ 29/840; 29/740; 29/743; 294/64.1
[58] Field of Search ................... 29/840, 740, 743; 294/64.1

[56] References Cited
U.S. PATENT DOCUMENTS

| | | | |
|---|---|---|---|
| 4,858,976 | 8/1989 | Stoll | 294/64.1 |
| 4,914,809 | 4/1990 | Fukai et al. | 29/743 X |
| 4,954,453 | 9/1990 | Venutolo | 29/742 X |
| 5,029,383 | 7/1991 | Snyder et al. | 29/740 |
| 5,056,765 | 10/1991 | Branstater | 269/20 |

Primary Examiner—Carl J. Arbes
Attorney, Agent, or Firm—R. B. Anderson

[57] ABSTRACT

A first flat surface portion (17) of an upper mounting member (11) is made to be parallel with a second flat surface portion (18) of a lower mounting member (12) by, first, supporting the lower mounting member on a spherical cushion of air defined by a lower surface portion (20). The first surface portion (17) is next brought into contact with the second surface portion (18) which causes an adjustment in the position of lower mounting member (12) so as to make the surfaces (17) and (18) coplanar. The air supply to the lower mounting member is then reversed to apply a vacuum which draws the lower mounting member (12) into contact with the support member (22) so as to fix the second surface portion (18) in a parallel relationship to that of the first surface portion (17).

12 Claims, 1 Drawing Sheet

DEVICE MANIPULATION APPARATUS AND METHOD

TECHNICAL FIELD

This invention relates to techniques for manipulating devices and, more particularly, to techniques for bonding an integrated circuit to a substrate.

BACKGROUND OF THE INVENTION

A technique for bonding integrated circuit chips to substrates known as "flip chip" bonding is characterized by an array of solder bumps on a lower surface of the chip and a matching array of solder bumps or bonding pads on an upper surface of the substrate. The solder bumps of the chip are brought into contact with the array on the substrate and sufficient heat and pressure are applied to make a permanent bond of the elements of the two arrays.

For mass production of such devices, it is generally required that the substrate be held by a stationary substrate holder, with the integrated circuit mounted in a vertically moveable vacuum holder which brings the integrated circuit into contact with the substrate. After bonding has been completed, the vacuum of the vacuum holder is released so that the integrated circuit is left bonded to the substrate. This procedure may be robotically controlled and is generally repeated in the production of numerous identical devices.

As circuit densities have increased, the number of solder bumps on each chip has increased and the size of each one has become smaller. Consequently, it has become increasingly important that the vacuum holder be properly registered with the substrate holder. That is, it is important that the integrated circuit be held by the vacuum holder such that its lower surface array of solder bumps lies in a plane which is parallel to the plane of the corresponding array on the substrate.

The copending application of L'Esperance et al., Ser. No. 07/691,658, filed Apr. 26, 1991, hereby incorporated by reference herein, describes a method for using television cameras to align the solder bumps of a chip with those of a substrate. The arrangement permits robotic alignment, but a condition for proper operation of the apparatus is that the horizontal plane of the chip holder be in a plane parallel to that of the substrate holder.

Accordingly, in apparatus for placing an article such as an integrated circuit chip on a substrate with very fine placement accuracy, there is a long-felt need for a technique for assuring that the chip is held in a plane that is parallel to the plane of the substrate.

SUMMARY OF THE INVENTION

In accordance with one embodiment of the invention, integrated circuit chip bonding apparatus comprises an upper mounting member having a first flat surface portion and a lower mounting member having a second flat surface portion facing the first flat surface portion. The lower mounting member is supported on a cushion of air, the air cushion being defined between a lower surface portion of the lower mounting member and an upper surface portion of the support member, both such surface portions being spherical. The first flat surface portion of the upper mounting member is contacted to the second flat surface portion of the lower member, thereby to cause an adjustment in the position of the lower mounting member as it moves on the cushion of air to make the second surface portion coplanar with the first surface portion. With the upper mounting member in continuous contact with the lower mounting member, the cushion of air is removed and, in its place, a vacuum is applied to cause the lower surface portion of the lower mounting member to bear against the upper surface portion of the support member, thereby to fix the second surface portion in coplanar alignment with the first surface portion. Thereafter, a chip is mounted on the first flat surface portion of the upper mounting member and a substrate is mounted on the second flat surface portion of the lower mounting member for flip-chip bonding. Since the surface portions of the mounting members are fixed in parallel, one is assured that the facing surfaces of the substrate and integrated circuit chip are parallel as is required for dependable flip-chip bonding.

These and other objects, features and benefits of the invention will be better understood from a consideration of the following detailed description taken in conjunction with the accompanying drawing.

DETAILED DESCRIPTION

Figure 1:
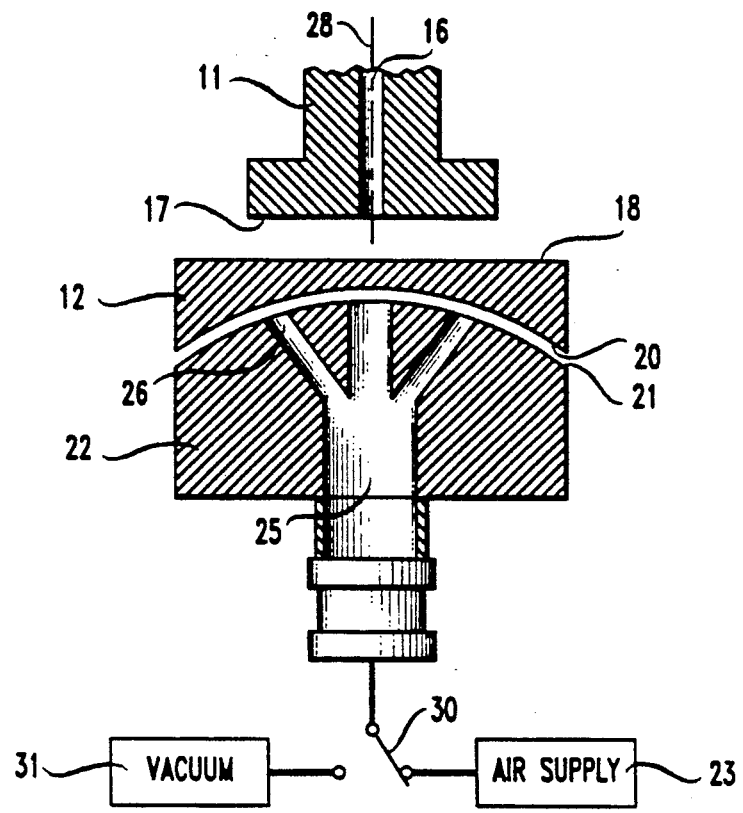
FIG. 1 is a partially sectioned view of a schematic representation of one embodiment of the invention.
Figure 2:
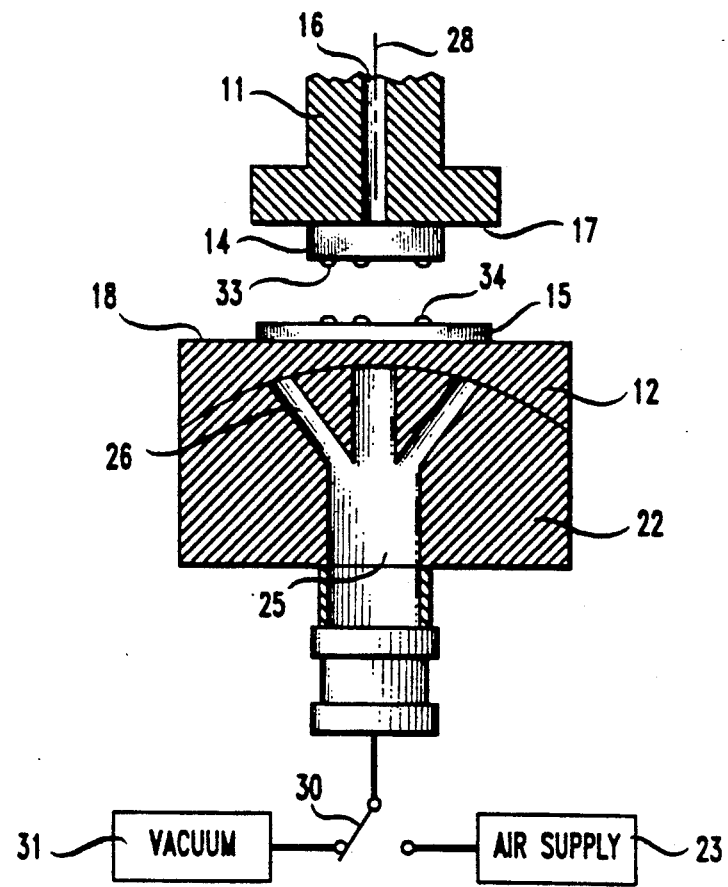
FIG. 2 is a view of the apparatus of FIG. 1 with a vacuum applied to the lower mounting member.

The drawings are intended to be schematic representations of the invention and are not necessarily drawn to scale; rather, they are drawn to give as clear a representation as possible of the important features of the invention. Referring now to FIG. 1, there is shown bonding apparatus comprising an upper mounting member 11 and a lower mounting member 12. As shown in FIG. 2, the upper mounting member 11 is a vacuum holder adapted to hold an integrated circuit 14 directly above a substrate 15. The integrated circuit 14 is held in position by a vacuum established in a known manner in a channel 16 of the upper mounting member. The integrated circuit 14 is held by the vacuum so as to bear against a first flat surface portion 17 of the upper mounting member 11, while the substrate 15 is mounted on a second flat surface portion 18 which faces the first flat surface portion 17. The upper mounting member is vertically moveable so that the integrated circuit 14 can be bonded to the substrate 15 using known flip-chip bonding techniques.

Referring again to FIG. 1, in accordance with the invention, prior to the mounting of the chip and substrate, the lower mounting member 12 is supported on a cushion of air, the air cushion being defined between a lower surface portion 20 of the lower mounting member and an upper surface portion 21 of a support member 22. The air cushion is provided by an air supply source 23 connected to a channel 25 within the support member. A plurality of connecting channels 26 communicate with surface 21 to provide a substantially uniform distribution of air along the surface 21. Surfaces 20 and 21 are spherical with substantially identical radius of curvature, and sufficient air pressure is supplied to provide a gap between surfaces 20 and 21 so that lower mounting member 12 is free to move on the cushion of air.

In accordance with the invention, the lower surface 17 of the upper mounting member 11 is registered with, and made coplanar with, the upper surface 18 of the lower mounting member 12 by lowering the upper member 11 until surface 17 physically contacts and bears against surface 18. This contact causes the lower mounting member 12 to adjust its position on the air cushion so that surface 18 is flush with surface 17; as a consequence, surface 18 is made to lie on the same plane as surface 17.

Upper mounting member 11 is fabricated in a known manner to move vertically, but the plane of surface 17 is fixed; that is, first surface portion 17 is always precisely perpendicular to a central axis 28 along which the upper mounting member moves. After the second surface portion 18 has been adjusted to be coplanar with the first surface portion 17, and while the upper mounting member 11 is bearing against it, the direction of air flow into channel 25 is reversed by switching the channel as schematically shown by switch 30, from the air supply source 23 to a vacuum source 31. Thus, with the switch 30 in the position shown in FIG. 2, the applied vacuum causes the lower mounting member 12 to bear against the support member 22. Since this operation is accomplished with upper mounting member 11 bearing against mounting member 12, the second surface 18 remains coplanar with the first surface 17. The vacuum fixes the lower mounting member 18 as the upper mounting member is withdrawn and during the remainder of the manufacturing cycle.

The upper mounting member 11 is withdrawn to the position shown in FIG. 2, the integrated circuit 14 is mounted on the first surface 17, and the substrate 15 is mounted on the second surface 18. The integrated circuit 14 contains an array of solder bumps 33 and the substrate contains a matching array of solder bumps 34. The integrated circuit 14 is bonded to the substrate 15 by simultaneously heating the solder bumps and lowering upper mounting member 11 such that solder bumps 33 forcibly bear against solder bumps 34 to effect thermocompression bonding. Heating to cause solder to flow is sometimes called "reflow," and sufficient reflow to permit bonding may be caused by only heating or a combination of heat and pressure. Also, it is common to use thermocompression bonding for bonding a solder bump to a metal bonding pad, rather than another solder bump. In any event, it can be appreciated that if one has a dense array of solder bumps 33 and 34, each bump being of a very small size, it is important that the first and second surface portions 17 and 18 be parallel; otherwise, all of the solder bumps would not make contact simultaneously and uniformly, with a consequent reduction or loss of reliability of some of the solder bonds.

In one embodiment of the invention that was made, channel 25 was circular, with a diameter of 1.1 inches, with nine connecting channels 26 arranged in a circular array, each channel 26 having a diameter of 0.272 inch. The lower mounting member 12 was cylindrical, with a diameter of 1.937 inch, and about ten pounds per square inch of pressure from air supply 23 was used to create an air cushion having a thickness or gap which is estimated at two to three mils. The air pressure was increased until the operator could manually detect an easy movement on the air cushion of lower mounting member 12. The radius of surfaces 20 and 21 was 3.125 inches.

The apparatus was used to bond integrated circuit chips having dimensions of one centimeter by one centimeter to a silicon substrate. The integrated circuit chip defined an array of photodetectors and it had solder bumps 34 arranged in a matrix of one hundred twenty-eight rows and one hundred twenty-eight columns for a total of 16,348 solder bumps. Each solder bump was thirty microns in diameter and the bumps were evenly spaced with a pitch of fifty microns. After registration of the upper and lower mounting members in accordance with the invention, the solder bump arrays on the integrated circuit and substrate were aligned using the principles of the copending L'Esperance et al. application referred to above. The invention made the first and second planes 17 and 18 sufficiently parallel that the array of solder bumps were successfully bonded in a known manner by the application of heat and pressure. It can be appreciated that if the first and second planes were not precisely parallel, some of the minute solder bumps would not have made sufficient contact to effect a reliable solder bond.

It is to be noted that the aligned surfaces 17 and 18 are used as reference surfaces for the mounting of the substrate and the integrated circuit chip, and it is assumed that these workpiece elements have parallel opposite surfaces. It is not necessary that the surfaces 17 and 18 be continuous; indeed, a cavity may be included in the first surface 17 for holding the chip and a similar cavity could be provided in second surface 18 for holding the substrate. If all of the various elements are accurately machined, parallel alignment of the surfaces 17 and 18 will be sufficient to assure parallel alignment of the opposite workpiece faces, as is required for flip-chip bonding. After parallel alignment in accordance with the invention, the bonding process can be robotically controlled in a known manner. Various methods other than a vacuum can be used for holding the integrated circuit on the upper mounting member 11. The substrate 15 may be capable of supporting a number of interconnected integrated circuit chips; it may be of the type known as a multichip module or it may be of ceramic of the type known as a hybrid integrated circuit. Various other modifications and embodiments may be made by those skilled in the art without departing from the spirit and scope of the invention.

We claim:

1. A method for manufacturing comprising the steps of:

providing an upper mounting member having a first flat surface portion and a lower mounting member having a second flat surface portion facing the first flat surface portion;

supporting the lower mounting member on a cushion of air, the air cushion being defined between a lower surface portion of the lower mounting member and an upper surface portion of a support member;

contacting the first flat surface portion of the upper mounting member with the second flat surface portion of the lower mounting member, thereby to cause an adjustment in the position of the lower mounting member to make the second surface portion substantially coplanar with the first surface portion;

and removing the cushion of air and applying a sufficient vacuum to the lower mounting member to cause the lower surface portion of the lower mounting member to bear against the upper surface portion of the support member, thereby to fix the second surface portion so as to be in alignment with the first surface portion;

and thereafter using the upper and lower mounting members for holding elements that are selectively brought into contact.

2. The method of claim 1 wherein:
the lower surface portion of the lower mounting member and the upper surface portion of the support member are spherical.

3. The method of claim 1 wherein:
the elements brought into contact comprise an electronic device having solder bumps that are brought into contact with bonding elements of a substrate mounted on the second surface portion.

4. The method of claim 3 further comprising the steps of:
after aligning, applying sufficient suction to the upper mounting member to hold thereon the electronic device;
lowering the upper mounting member to cause the solder bumps to contact the bonding elements;
and heating the solder bumps sufficiently to reflow them and cause bonding to the bonding elements.

5. A method of bonding a first element to a second element comprising the steps of: mounting the first element in an upper mounting member that is vertically moveable; mounting the second element on a lower mounting member; lowering the upper mounting member to bring the first element into contact with the second element and causing parts of the first element to be bonded to parts of the second element, wherein the improvement comprises:
providing a first flat surface as a lower surface of the upper mounting member and providing a second flat surface as an upper surface on the lower mounting member, the second flat surface facing the first flat surface;
supporting the lower mounting member on a spherical cushion of air;
aligning the second flat surface with the first flat surface comprising the step of lowering the upper mounting member to bring the first flat surface into contact with the second flat surface, thereby to make the second flat surface coplanar with the first flat surface;
removing the air cushion and fixing the position of the lower mounting member such that the second flat surface remains coplanar with the first flat surface;
and mounting the first element in the upper mounting member in predetermined registration with the first flat surface and mounting the second element on the lower mounting member in predetermined registration with the second flat surface, whereby the first element is aligned with the second element.

6. The method of claim 5 wherein:
the step of removing the air cushion and fixing the position of the lower mounting member comprises the step of applying a vacuum to a channel in a supporting member which draws the lower mounting member into contact with the supporting member.

7. The method of claim 6 wherein:
the first element is an integrated circuit having thereon an array of solder bumps and the second element is a substrate having thereon an array of bonding elements adapted to be bonded to the solder bumps.

8. Manufacturing apparatus comprising:
an upper mounting member having a first flat surface portion;
a lower mounting member having a second flat surface portion facing the first flat surface portion;
said lower mounting member having a spherical lower surface portion;
a support member having a spherical upper surface portion;
means for producing a cushion of air between the upper surface of the support member and the lower surface portion of the lower mounting member;
the upper mounting member being vertically moveable to a position at which the first surface portion thereof contacts the second flat surface portion of the lower mounting member, thereby to cause an adjustment in the position of the lower mounting member to make the second surface portion substantially coplanar with the first surface portion;
means for removing the cushion of air and supplying a sufficient vacuum to the lower mounting member to cause the lower surface portion of the lower mounting member to bear against the upper surface portion of the support member, thereby to fix the second surface portion so as to be in alignment with the first surface portion;
means for holding a first element in the lower mounting member;
and means for holding a second element in the upper mounting member that may be selectively brought into contact with the first element.

9. The apparatus of claim 8 further comprising:
a central channel in the support member and a plurality of connecting channels communicating with the central channel and the upper surface portion of the support member;
and means for selectively applying either air pressure or a vacuum to the central channel.

10. The apparatus of claim 8 wherein:
the first element is an integrated circuit having on a lower surface in excess of one thousand solder bumps;
and the second element is a substrate having in excess of one thousand bonding elements each of which is to be bonded to a solder bump.

11. The apparatus of claim 8 wherein:
the upper surface of the support member and the lower surface portion of the lower mounting member both describe spherical sections having substantially identical radii of curvature.

12. A method for manufacturing comprising the steps of:
providing an upper member having a first flat surface portion and a lower mounting member having a second flat surface portion facing the first flat surface portion;
supporting the lower mounting member on a spherical cushion of air, the air cushion being defined between a lower spherical surface portion of the lower mounting member and an upper surface spherical portion of a support member;
contacting the first flat surface portion of the upper member with the second flat surface portion of the lower member, thereby to cause an adjustment in the position of the lower member to make the second surface portion substantially coplanar with the first surface portion;
and removing the cushion of air and applying a sufficient vacuum to the lower mounting member to cause the lower surface portion of the lower mounting member to bear against the upper surface portion of the support member, thereby to fix the second surface portion so as to be in alignment with the first surface portion;

and thereafter using the upper member to move against the lower member for manufacture of a workpiece therebetween.

* * * * *